United States Patent [19]

Rosan

[11] Patent Number: 4,914,504

[45] Date of Patent: Apr. 3, 1990

[54] OPTO-ELECTRONIC IMAGE SENSOR ARRANGEMENT

[75] Inventor: Karlheinz Rosan, Munich, Fed. Rep. of Germany

[73] Assignee: Siemens Aktiengesellschaft, Berlin and Munich, Fed. Rep. of Germany

[21] Appl. No.: 202,553

[22] Filed: Jun. 6, 1988

[30] Foreign Application Priority Data

Aug. 10, 1987 [DE] Fed. Rep. of Germany ....... 3726569

[51] Int. Cl.$^4$ ............................................. H01L 21/90
[52] U.S. Cl. ................................ 357/30 H; 357/30 G; 357/30 Q; 357/65; 357/68
[58] Field of Search ............. 353/30; 357/30 G, 30 H, 357/30 Q, 65, 68

[56] References Cited

U.S. PATENT DOCUMENTS 4,680,477  7/1987  Sato ................................... 357/30 H

FOREIGN PATENT DOCUMENTS 0148620  7/1985  European Pat. Off. .

OTHER PUBLICATIONS

Proceedings of SPIE-The International Society for Optical Engineering, Jan. 21-22, 1986, Los Angeles, California, "a-Si:H Image Sensor: Some Aspects of Physics and Performance", by K. Kempter, pp. 120-126.

IEEE Transactions on Components, Hybrids, and Manufacturing Technology, vol. CHMT-9, No. 3, Sep. 1986, "Analysis and Design of a Large-Scale Linear Image Sensor Using Amorphous Silicon", by Kouichi Seki et al, pp. 304-309.

Mat. Res. Soc. Symp. Proc., vol. 70-1986 Materials Research Society, "A-SI:H Image Sensors: Some Aspects of Physics and Performance", by K. Rosan et al, pp. 683-688.

Conference Volume of IEEE Conf. on Photo Electronic Imaging, London, 1985, No. 253, pp. 92 through 95, "Investigations on the Performance of an a-Si:H Linear Image Sensor", by K. Rosan et al.

Primary Examiner—Andrew J. James
Assistant Examiner—David Soltz
Attorney, Agent, or Firm—Hill, Van Santen, Steadman & Simpson

[57] ABSTRACT

Thin-film photodiodes arranged in lines on a substrate are connected to read-out chips arranged on the same substrate. They are connected thereto via thin-film interconnects which differ in length and which run parallel to one another. For compensating the interconnect capacitances given neighboring interconnects which differ in length, their widths are dimensioned smaller or larger in one or more interconnect sub-sections. Thus, the sum of the coupling capacitances of all sub-sections of two neighboring interconnects always have the same value, independently of the overall length. The invention eliminates the inhomogeneities in the sensor signal caused by the different lengths of the read-out lines. The invention is employed for opto-electronic reading equipment, particularly in office automation.

8 Claims, 3 Drawing Sheets

OPTO-ELECTRONIC IMAGE SENSOR ARRANGEMENT

BACKGROUND OF THE INVENTION

The invention is directed to an opto-electronic image sensor arrangement. Thin-film photodiodes are arranged on a substrate in lines and are connected to a read-out circuit arranged on the same substrate via thin-film interconnects that differ in length and proceed parallel to one another. Charge carriers generated in the photodiodes by the light reflected from the image master can be read out as electrical signals.

Modern communications and office automation require read equipment that can pick up not only texts but also graphics and images as well as from a sheet of paper and can read them into a computer.

For this purpose, work has been carried out for some time in developing opto-electronic line sensors for image pick-up through the use of which such masters can be read without optical demagnification. Such line sensors can be manufactured in a hybrid technology wherein thin-film photodiodes are arranged in a row and are connected to read-out chips via thin-film interconnects. Further details regarding the structure and the properties of an image sensor on the basis of amorphous, hydrogenated silicon (a-Si:H) may be derived from a report by K. Kempter in the Proceedings of the Society of Photo-Optical Instrumentation Engineers, Vol. 617 Amorphous Semiconductors for Microelectronics (1986), pages 120 through 126, incorporated herein.

The light reflected by the master generates charge carriers in the photodiodes. In the integration method, the charge carriers are collected in storage capacitors over a certain time (integration time), and are read out with the readout circuit at the end of this integration time. FIG. 1 shows an equivalent circuit diagram that contains the capacitors essential for the signal formation. The storage capacitor for every photodiode is formed by the photodiode capacitance ($C_d$) itself, by the capacitance of the corresponding input of the read-out circuit, and by the capacitances of the read-out line ($C_p$ and $C_c$). Given a prescribed signal charge, the signal voltage at the photodiodes is inversely proportional to the size of the storage capacitance. Since the capacitances of the interconnects are part of the storage capacitances, different lengths of the read-out lines lead to corresponding inhomogeneities in the sensor signal. The light sensitivity of the sensor, the cross-talk between neighboring elements, and the modulation transmission (MTF) associated therewith are then topically dependent. Greater details regarding the influence of the interconnect capacitances on the sensor signal may be derived from the report by Rosan et al. in the Conference Volume of IEEE Conf. on Photo Electronic Imaging, London, 1985, No. 253, pages 92 through 95, incorporated herein.

There is thus the problem in the prior art of signal inhomogeneities caused by differing lengths of read-out lines. This problem has not been satisfactorily resolved in the prior art. The path of the interconnects is largely defined by the dimensions of the read-out circuit preferably integrated on a chip, by the pad arrangement thereof, and by the number of photodiodes per mm. The differing length of the read-out lines necessarily derives from the lower density of the bond pads on the read-out chips compared to the photodiodes, as may be derived from FIG. 1 in the report by Rosan and Brunst in the Conference Volume of the 1986 Materials Research Society Symposium Proceedings, Vol. 70, pages 683 through 688, incorporated herein.

In European Patent application 0 148 620 incorporated herein, this problem is dealt with for an image sensor wherein a ground plane (grounded metallic shielding layer) entirely or partially covers the interconnects, and is separated from the interconnects by an insulator layer. The interconect and ground plane then forms a type of plate capacitor. A stray capacitance thereby arises between every interconnect and the ground plane, this stray capacitance being higher the longer the line. In order to compensate the signal inhomogeneities resulting therefrom, the sum of all stray capacitances connected to a cell must be made of the same size in this case. For this purpose, it is proposed to make the area of all interconnects identical in size, or to provide the capacitance balancing via an additional overlapped capacitance that is not illuminated and is connected to the cell.

SUMMARY OF THE INVENTION

It is an object of the invention to eliminate the signal inhomogeneities caused by the differing length of the read-out lines.

The present invention solves the problem of signal inhomogeneities as a consequence of interconnect coupling in an image sensor of the type initially cited in the following manner. For compensating the interconnect coupling capacitances given neighboring interconnects differing in length, the widths in one or more interconnect sub-sections are dimensioned larger or smaller, so that the sum of the coupling capacitances of all sub-sections of two neighboring interconnects always has the same value regardless of the overall length.

The following considerations have led to the invention. The mutual capacitive coupling of two parallel interconnects having the length l, the width b, and the spacing a between the interconnects derives from the following relationship:

$$C = \frac{\epsilon_o \cdot L}{2} (1 + \epsilon_v) \frac{K(k')}{K(k)} \quad (1)$$

$$\text{where } k = \frac{a}{2b + a} \text{ and } k' = \sqrt{1 - k^2}.$$

$K(k)$ and $K(k')$ are complete eliptical integrals of the first species and $\epsilon_o$ or $\epsilon_v$ are the dielectric constants of the vacuum or of the carrier material.

In a first approximation (thin-film technology), the thickness of the lines has no influence on the coupling capacitances.

Given a prescribed path of the interconnects, the center-to-center spacings of the interconnect sub-sections are fixed. Given a fixed center-to-center spacing m of two parallel interconnect sections, the quantity k is then only dependent on the interconnect width b:

$$k = \frac{m - b}{m + b} \quad (2)$$

In this case, the coupling capacitance is only a function of the length and of the width:

$$C = C(l,b) \quad (3)$$

The coupling capacitance of two straight interconnect pairs of different length given a maintained width of the one interconnect pair can then be made of the same size via a width to be calculated according to equation (3) for the second interconnect pair.

The coupling capacitance of an interconnect in a bending-off interconnect bus is calculated from the sum of the coupling capacitances of the interconnect sub-sections:

$$C = \sum_i C_i(l_i, b_i) \qquad (4)$$

From this the possibility results of compensating different coupling capacitances of neighboring lines via a larger or smaller width of one or more interconnect sub-sections, and the sum of the coupling capacitances of all sub-sections of two neighboring interconnects always provides the same value independently of the actual, overall length.

Similar capacitance calculations were presented in a report by Seki et al. in the IEEE Transactions on Components, Hybrids and Manufacturing Technology, Vol. CHMT9, No. 3, September 1986, pages 304 through 309, incorporated herein. Here, the interconnects must have identical lengths for achieving identical capacitances (this, however, being difficult to realize because of the demand made of the resolution). The principle underlying the invention of compensating the influence of the interconnect length on the coupling capacitance via the interconnect width, can be derived neither from the calculations of Seki nor from the determinations made in European Patent application 0 148 620.

DESCRIPTION OF THE PREFERRED EMBODIMENTS

Figure 1:
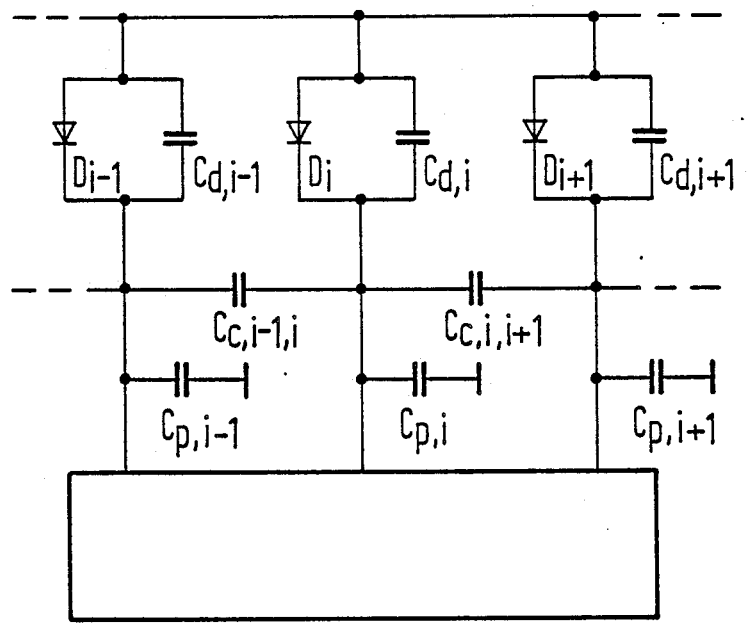
FIG. 1 shows an equivalent circuit diagram of a prior art arrangement of image pick-up sensor, illustrating capacitors employed for signal formation.
Figure 2:
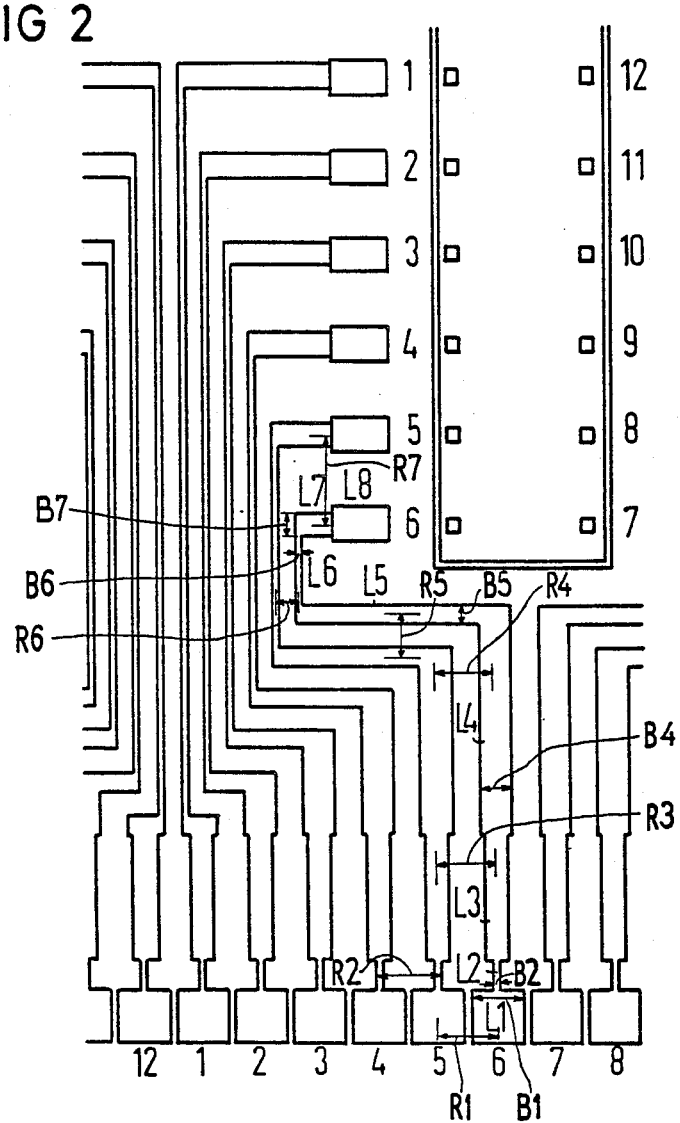
FIG. 2 is an illustration of the path of interconnects between a photodiode line and a chip.
Figure 3:
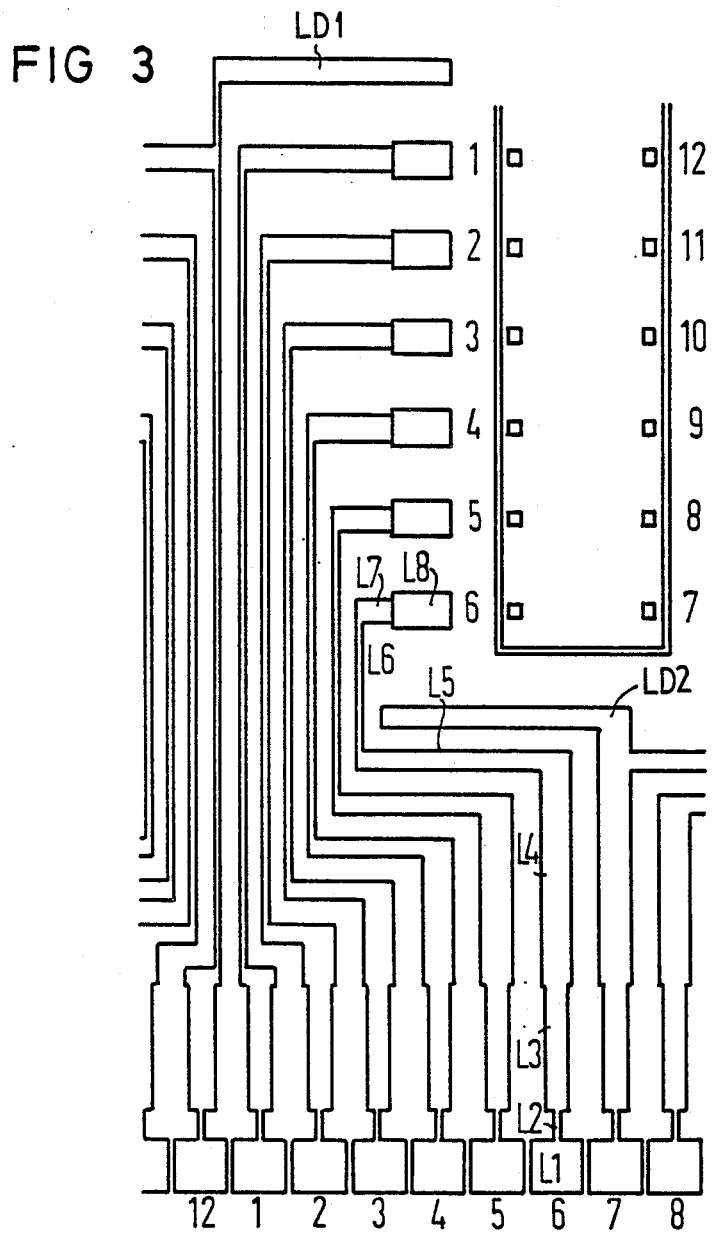
FIG. 3 is an alternate embodiment of FIG. 2.

FIGS. 2 and 3 schematically show the path of interconnects between a photodiode line and a chip having six respective inputs per long side.

FIG. 2 is a portion of a 4-inch functional model of a a-Si:H hybrid line sensor having the designation OSCAR 2B. Such a sensor is described in the initially cited report by Rosan and Brunst. The read-out chips used herein comprise 64 inputs per long side. The interconnect pattern of the read-out lines between photodiode array and chip-side bond pads is symmetrical relative to the longitudinal axis of the chip. Beginning at the a-Si:H sensor elements, the interconnects initially all proceed parallel, whereby the interconnect density corresponds to the sensor element density. At different distances from the sensor elements, the interconnects bend off and are conducted to the long chip side. The interconnect density increases between the chips in order to make room for the chips. All lines of a chip half have different lengths. The maximum and the minimum interconnect lengths differ by the factor 2.3 given the model presented here.

FIG. 2

Beginning with the base electrode of the photodiode, the individual interconnect sections here were consecutively numbered from L1 through L8 (=bond pad). The sub-sections L4 through L7 are different lengths from interconnect to interconnect. The sub-sections L1 through L3 as well as the bond pad L8 remain identical in length and therefore always supply the same additive amount to the interconnect capacitance.

The length of the interconnect sections L4 increases with increasing interconnect number by the respective center-to-center spacing R5 between sections L5. The length of interconnect sections L5 increases by R4. Sections L6 decrease by center-to-center spacings R5+R7. Sections L7 decrease by center-to-center spacing R6. The overall length thus changes by the same amount.

Since according to equation (1) the capacitance is directly proportional to the length, the change $\Delta C$ of the overall interconnect capacitance $C_{ges}$ is also constant given a constant length change.

$$\Delta C = R5 \times C'(R4, B4) + R4 \times C'(R5, B5) - (R5 + R7) \times C'(B6, R6) - R6 \times C'(B7, R7) \qquad (2)$$

where $$C' = C/l \qquad (3)$$

references the capacitance per length unit.

Table 1 lists the coupling capacitances of the interconnects in the function model OSCAR 2B with the known design. The coupling capacitances C4 through C7 of the interconnect sub-sections L4 through L7 which are different in length are found next to the interconnect number. Their sum is found under $C_{ges}$. The width B and the center-to-center spacing (grid) R of the respective interconnect sub-section are also indicated above the respect columns. The respective coupling between the interconnect having the number N and the number N−1 has also been calculated.

The capacitance decreases from No. 2 to No. 64 with increasing interconnect number. The coupling capacitance $C_{ges}$ between line 1 and line 2 amounts to 0.785 pF; and between lines 63 and 64, it amounts to only 0.469 pF, i.e. is 0.6 times smaller.

The capacitance between lines 1 and 2 essentially stems from the interconnect section L6. In contrast thereto, the main quantity at the interconnect pair 63 and 64 derives from L4. It is therefore possible to compensate the decrease from C6 by a corresponding increase of C4. Given the requirement that $\Delta C=0$, then from equation (2) the following results:

$$C'(R4,B4) = ((R5+R7) \times C'(B6,R6) + R6 \times C'(B7,R7) - R4 \times C'(B5,R5))/R5 \qquad (4)$$

Since the grid R4 is determined by the sensor element density, the compensation must be carried out via the interconnect width in this case. The original width of B4=40 μm is then increased to the value of 58.6 μm which is newly calculated with equations (1) and (4). The exemplary embodiment was calculated with 59 μm since the design system available only allows whole μm units. In the exemplary embodiment, the interconnect width B4 was calculated for capacitance compensation; this is likewise possible for the other interconnect widths. Moreover, a modification of the grid can also be undertaken in this regard.

Table 2 lists the coupling capacitances of the interconnects in the function model OSCAR 2B with the design modified according to the invention.

The interconnect capacitance is now practically independent of the interconnect number. The coupling capacitance $C_{ges}$ between lines 1 and 2 amounts to 0.788 pF here; it is 0.798 pF between lines 63 and 64. The two values differ by only somewhat more than 1%. This fluctuation results from the difference between the condensation width actually used and the exact compensation width.

In order to compensate those differences in the interconnect capacitances still existing upon transition from one chip to the next (0.726 pF between lines 128 and 1) or, respectively, from one chip half to the other (0.540 pF between lines 64 and 65), in one form of the invention "blind lines" are additionally inserted into the layout at these locations.

FIG. 3 shows an exemplary embodiment of these blind or dummy lines LD1 and LD2 that are intended here to replace the one neighboring interconnect sub-section L7 missing at line 1 and the one neighboring bond pad L8, as well as the missing neighboring sub-sections L5, L6, L7 at line 6 and the one neighboring bond pad L8.

When the width of the respectively neighboring interconnect sub-section is used for the blind or dummy lines, then, given a pre-selected length, the spacing required for a capacitance compensation can again be calculated with reference to relationship 1, and the required length can be calculated given a pre-selected spacing.

The image sensor of the invention fully meets the requirement that the light sensitivity, the cross-talk between neighboring elements, and the modulating transmission are topically independent.

Although various minor changes and modifications might be proposed by those skilled in the art, it will be understood that I wish to include within the claims of the patent warranted hereon all such changes and modifications as reasonably come within my contribution of the art.

TABLE 1

| B/R No. | 40/85 C4 | 49/98 C5 | 25/50 C6 | 60/180 C7 | $C_{ges}$ |
|---|---|---|---|---|---|
| 1 | 0.000 | 0.000 | 0.726 | 0.000 | 0.726 |
| 2 | 0.002 | 0.003 | 0.715 | 0.065 | 0.785 |
| 3 | 0.005 | 0.007 | 0.704 | 0.064 | 0.780 |
| 4 | 0.008 | 0.010 | 0.693 | 0.063 | 0.774 |
| 5 | 0.012 | 0.013 | 0.683 | 0.062 | 0.769 |
| 6 | 0.015 | 0.017 | 0.672 | 0.061 | 0.764 |
| 7 | 0.019 | 0.020 | 0.661 | 0.060 | 0.759 |
| 8 | 0.022 | 0.023 | 0.650 | 0.059 | 0.754 |
| 9 | 0.025 | 0.026 | 0.639 | 0.058 | 0.749 |
| 10 | 0.029 | 0.030 | 0.629 | 0.057 | 0744 |
| 11 | 0.032 | 0.033 | 0.618 | 0.057 | 0.739 |
| 12 | 0.036 | 0.036 | 0.607 | 0.055 | 0.734 |
| 13 | 0.039 | 0.040 | 0.596 | 0.054 | 0.729 |
| 14 | 0.042 | 0.043 | 0.585 | 0.053 | 0.724 |
| 15 | 0.046 | 0.046 | 0.575 | 0.052 | 0.719 |
| 16 | 0.049 | 0.050 | 0.564 | 0.051 | 0.713 |
| 17 | 0.052 | 0.053 | 0.553 | 0.050 | 0.708 |
| 18 | 0.056 | 0.056 | 0.542 | 0.049 | 0.703 |
| 19 | 0.059 | 0.059 | 0.532 | 0.048 | 0.698 |
| 20 | 0.063 | 0.063 | 0.521 | 0.047 | 0.693 |
| 21 | 0.066 | 0.066 | 0.510 | 0.046 | 0.688 |
| 22 | 0.069 | 0.069 | 0.499 | 0.045 | 0.683 |
| 23 | 0.073 | 0.073 | 0.488 | 0.044 | 0.678 |
| 24 | 0.076 | 0.076 | 0.478 | 0.043 | 0.673 |
| 25 | 0.080 | 0.079 | 0.467 | 0.042 | 0.668 |
| 26 | 0.083 | 0.083 | 0.456 | 0.041 | 0.663 |
| 27 | 0.086 | 0.086 | 0.445 | 0.040 | 0.658 |
| 28 | 0.090 | 0.089 | 0.434 | 0.039 | 0.652 |
| 29 | 0.093 | 0.092 | 0.424 | 0.038 | 0.647 |
| 30 | 0.096 | 0.096 | 0.413 | 0.037 | 0.642 |
| 31 | 0.100 | 0.099 | 0.402 | 0.036 | 0.637 |
| 32 | 0.103 | 0.102 | 0.391 | 0.035 | 0.632 |
| 33 | 0.107 | 0.106 | 0.380 | 0.035 | 0.627 |
| 34 | 0.110 | 0.109 | 0.370 | 0.034 | 0.622 |
| 35 | 0.113 | 0.112 | 0.359 | 0.033 | 0.617 |
| 36 | 0.117 | 0.116 | 0.348 | 0.032 | 0.612 |
| 37 | 0.120 | 0.119 | 0.337 | 0.031 | 0.607 |
| 38 | 0.123 | 0.122 | 0.326 | 0.030 | 0.602 |
| 39 | 0.127 | 0.125 | 0.316 | 0.029 | 0.597 |
| 40 | 0.130 | 0.129 | 0.305 | 0.028 | 0.591 |
| 41 | 0.134 | 0.132 | 0.294 | 0.027 | 0.586 |
| 42 | 0.137 | 0.135 | 0.283 | 0.026 | 0.581 |
| 43 | 0.140 | 0.139 | 0.272 | 0.025 | 0.576 |
| 44 | 0.144 | 0.142 | 0.262 | 0.024 | 0.571 |
| 45 | 0.147 | 0.145 | 0.251 | 0.023 | 0.566 |
| 46 | 0.151 | 0.149 | 0.240 | 0.022 | 0.561 |
| 47 | 0.154 | 0.152 | 0.229 | 0.021 | 0.556 |
| 48 | 0.157 | 0.155 | 0.218 | 0.020 | 0.551 |
| 49 | 0.161 | 0.158 | 0.208 | 0.019 | 0.546 |
| 50 | 0.164 | 0.162 | 0.197 | 0.018 | 0.541 |
| 51 | 0.167 | 0.165 | 0.186 | 0.017 | 0.536 |
| 52 | 0.171 | 0.168 | 0.175 | 0.016 | 0.530 |
| 53 | 0.174 | 0.172 | 0.164 | 0.015 | 0.525 |
| 54 | 0.178 | 0.175 | 0.154 | 0.014 | 0.520 |
| 55 | 0.181 | 0.178 | 0.143 | 0.013 | 0.515 |
| 56 | 0.184 | 0.182 | 0.132 | 0.012 | 0.510 |
| 57 | 0.188 | 0.185 | 0.121 | 0.011 | 0.505 |
| 58 | 0.191 | 0.188 | 0.110 | 0.010 | 0.500 |
| 59 | 0.195 | 0.191 | 0.100 | 0.009 | 0.495 |
| 60 | 0.198 | 0.195 | 0.089 | 0.008 | 0.490 |
| 61 | 0.201 | 0.198 | 0.078 | 0.007 | 0.485 |
| 62 | 0.205 | 0.201 | 0.067 | 0.006 | 0.480 |
| 63 | 0.208 | 0.205 | 0.056 | 0.005 | 0.475 |
| 64 | 0.211 | 0.208 | 0.046 | 0.004 | 0.469 |
| 65 | 0.211 | 0.000 | 0.000 | 0.000 | 0.211 |

TABLE 2

| B/R No. | 59/85 C4 | 49/98 C5 | 25/50 C6 | 60/180 C7 | $C_{ges}$ |
|---|---|---|---|---|---|
| 1 | 0.000 | 0.000 | 0.726 | 0.000 | 0.726 |
| 2 | 0.004 | 0.004 | 0.715 | 0.065 | 0.788 |
| 3 | 0.013 | 0.007 | 0.704 | 0.064 | 0.788 |
| 4 | 0.022 | 0.010 | 0.693 | 0.063 | 0.788 |
| 5 | 0.030 | 0.014 | 0.683 | 0.062 | 0.788 |
| 6 | 0.039 | 0.017 | 0.672 | 0.061 | 0.788 |
| 7 | 0.048 | 0.020 | 0.661 | 0.060 | 0.788 |
| 8 | 0.056 | 0.023 | 0.650 | 0.059 | 0.789 |
| 9 | 0.065 | 0.027 | 0.639 | 0.058 | 0.789 |
| 10 | 0.073 | 0.030 | 0.629 | 0.057 | 0.789 |
| 11 | 0.082 | 0.033 | 0.618 | 0.056 | 0.789 |
| 12 | 0.091 | 0.037 | 0.607 | 0.055 | 0.789 |
| 13 | 0.099 | 0.040 | 0.596 | 0.054 | 0.790 |
| 14 | 0.108 | 0.043 | 0.585 | 0.053 | 0.790 |
| 15 | 0.117 | 0.047 | 0.575 | 0.052 | 0.790 |
| 16 | 0.125 | 0.050 | 0.564 | 0.051 | 0.790 |
| 17 | 0.134 | 0.053 | 0.553 | 0.050 | 0.790 |
| 18 | 0.143 | 0.056 | 0.542 | 0.049 | 0.790 |
| 19 | 0.151 | 0.060 | 0.532 | 0.048 | 0.791 |
| 20 | 0.160 | 0.063 | 0.521 | 0.047 | 0.791 |
| 21 | 0.168 | 0.066 | 0.510 | 0.046 | 0.791 |
| 22 | 0.177 | 0.070 | 0.499 | 0.045 | 0.791 |
| 23 | 0.186 | 0.073 | 0.488 | 0.044 | 0.791 |
| 24 | 0.194 | 0.076 | 0.478 | 0.043 | 0.791 |
| 25 | 0.203 | 0.080 | 0.467 | 0.042 | 0.792 |
| 26 | 0.212 | 0.083 | 0.456 | 0.041 | 0.792 |
| 27 | 0.220 | 0.086 | 0.445 | 0.040 | 0.792 |
| 28 | 0.229 | 0.089 | 0.434 | 0.039 | 0.792 |
| 29 | 0.238 | 0.093 | 0.424 | 0.038 | 0.792 |
| 30 | 0.246 | 0.096 | 0.413 | 0.037 | 0.793 |
| 31 | 0.255 | 0.099 | 0.402 | 0.036 | 0.793 |
| 32 | 0.263 | 0.103 | 0.391 | 0.035 | 0.793 |
| 33 | 0.272 | 0.106 | 0.380 | 0.035 | 0.793 |
| 34 | 0.281 | 0.109 | 0.370 | 0.034 | 0.793 |
| 35 | 0.289 | 0.113 | 0.359 | 0.033 | 0.793 |

TABLE 2-continued

| B/R No. | 59/85 C4 | 49/98 C5 | 25/50 C6 | 60/180 C7 | $C_{ges}$ |
|---|---|---|---|---|---|
| 36 | 0.298 | 0.116 | 0.348 | 0.032 | 0.793 |
| 37 | 0.307 | 0.119 | 0.337 | 0.031 | 0.794 |
| 38 | 0.315 | 0.123 | 0.326 | 0.030 | 0.794 |
| 39 | 0.324 | 0.126 | 0.316 | 0.029 | 0.794 |
| 40 | 0.333 | 0.129 | 0.305 | 0.028 | 0.794 |
| 41 | 0.341 | 0.132 | 0.294 | 0.027 | 0.794 |
| 42 | 0.350 | 0.136 | 0.283 | 0.026 | 0.794 |
| 43 | 0.358 | 0.139 | 0.272 | 0.025 | 0.795 |
| 44 | 0.367 | 0.142 | 0.262 | 0.024 | 0.795 |
| 45 | 0.376 | 0.146 | 0.251 | 0.023 | 0.795 |
| 46 | 0.384 | 0.149 | 0.240 | 0.022 | 0.795 |
| 47 | 0.393 | 0.152 | 0.229 | 0.021 | 0.795 |
| 48 | 0.402 | 0.156 | 0.218 | 0.020 | 0.795 |
| 49 | 0.410 | 0.159 | 0.208 | 0.019 | 0.796 |
| 50 | 0.419 | 0.162 | 0.197 | 0.018 | 0.796 |
| 51 | 0.428 | 0.165 | 0.186 | 0.017 | 0.796 |
| 52 | 0.436 | 0.169 | 0.175 | 0.016 | 0.796 |
| 53 | 0.445 | 0.172 | 0.164 | 0.015 | 0.796 |
| 54 | 0.453 | 0.175 | 0.154 | 0.014 | 0.796 |
| 55 | 0.462 | 0.179 | 0.153 | 0.013 | 0.797 |
| 56 | 0.471 | 0.182 | 0.132 | 0.012 | 0.797 |
| 57 | 0.479 | 0.185 | 0.121 | 0.011 | 0.797 |
| 58 | 0.488 | 0.189 | 0.110 | 0.010 | 0.797 |
| 59 | 0.497 | 0.192 | 0.100 | 0.009 | 9.797 |
| 60 | 0.505 | 0.195 | 0.089 | 0.008 | 0.798 |
| 61 | 0.154 | 0.198 | 0.078 | 0.007 | 0.798 |
| 62 | 0.523 | 0.202 | 0.067 | 0.006 | 0.798 |
| 63 | 0.531 | 0.205 | 0.056 | 0.005 | 0.798 |
| 64 | 0.540 | 0.208 | 0.046 | 0.004 | 0.798 |
| 65 | 0.054 | 0.000 | 0.000 | 0.000 | 0.540 |

I claim as my invention:

1. An opto-electronic image sensor arrangement, comprising:
thin-film photodiodes arranged in a row on a substrate and connected by interconnects to a read-out chip means arranged on said substrate, said read-out chip means reading out as electrical signals charge carriers generated in the photodiodes by light reflected from an image master and conducted by the interconnects to the read-out chip means; and
means for compensating interconnect coupling capacitances of neighboring interconnects differing in length, said means comprising the neighboring interconnects each being divided into sub-sections, and the sub-sections of the neighboring interconnects which are directly adjacent one another having a same width, the sub-sections of each interconnect having varying widths such that a sum of coupling capacitances of all sub-sections of the neighboring interconnects always has a same value independently of overall length of the interconnects.

2. A sensor arrangement according to claim 1 wherein additional dummy section means are provided connected to at least one of said interconnects for compensating differences of interconnect coupling capacitances to compensate for differences from one read-out chip to a next or from one chip half to another half.

3. An image sensor arrangement according to claim 1 wherein a semiconductor body of said photodiodes is formed of amorphous, hydrogenated silicon (a-Si:H).

4. An opto-electronic image sensor arrangement, comprising:
a row of thin-film photodiodes arranged on a substrate;
a read-out chip on the substrate, said read-out chip having inputs;
each photodiode having an associated interconnect connecting the photodiode to an associated input of the read-out chip;
the interconnects running parallel to one another and differing in overall length; and
each of the interconnects having a plurality of sub-sections of differing width, and the sub-sections of the interconnects lying parallel to and laterally spaced from, one another all having a substantially same width and being spaced from their nearest neighbors by a substantially same spacing distance, such that a total coupling capacitance of each of the interconnects is substantially equal to one another independent of differing overall length thereof.

5. An opto-electronic image sensor arrangement, comprising:
a row of thin-film photodiodes arranged on the substrate;
a read-out circuit on the substrate, said read-out circuit having inputs;
each photodiode having an associated interconnect connecting the photodiode to an associated input of the read-out circuit;
said interconnects running parallel to one another, having at least one bend, and differing in overall length;
each of the interconnecting having a coupling capacitance with respect to neighboring interconnects; and
each of the interconnects having a plurality of sub-sections of differing width, and the sub-sections of the interconnects lying parallel and laterally spaced from one another all having a substantially same width, and being spaced from their nearest neighbors by a substantially same spacing distance, such that a total coupling capacitance of each of the interconnects is substantially equal to one another independent of differing overall length thereof.

6. An arrangement according to claim 5 wherein at least one set of parallel laterally spaced sub-sections of the interconnects has a progressively decreasing length.

7. An arrangement according to claim 5 wherein at last one interconnect which has a neighboring interconnect at one side of a sub-section thereof but no neighboring interconnect at the other side of the sub-section has a dummy sub-section extending therefrom to compensate for absence of the neighboring interconnect at the one side.

8. An opto-electronic image sensor arrangement, comprising:
a row of thin-film photodiodes arranged on the substrate;
a read-out circuit on the substrate, said read-out circuit having inputs;
each photodiode having an associated interconnect connecting the photodiode to an associated input of the read-out circuit;
said interconnects running parallel to one another and differing in overall length;
each of the interconnects having a coupling capacitance with respect to neighboring interconnects;
each of the interconnects having means associated therewith for making a total coupling capacitance of each of the interconnects substantially equal to one another; and
said means comprising each of the interconnects having a plurality of sub-sections which differ in width and length from one another.

* * * * *